United States Patent
Drumm et al.

(10) Patent No.: US 9,886,028 B2
(45) Date of Patent: Feb. 6, 2018

(54) AUTOMATION FACILITY AND METHOD FOR EXPANDING THE AUTOMATION FACILITY WITH AT LEAST ONE FIELD DEVICE

(71) Applicant: Siemens Aktiengesellschaft, Munich (DE)

(72) Inventors: Oliver Drumm, Eggenstein-Leopoldshafen (DE); Christian Heck, Remchingen (DE); Rolf Kraus, Rheinstetten (DE); Benjamin Lutz, Pfinztal (DE); Gerrit Wolf, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/093,000

(22) Filed: Apr. 7, 2016

(65) Prior Publication Data

US 2017/0023932 A1   Jan. 26, 2017

(30) Foreign Application Priority Data

Apr. 13, 2015 (EP) .................................... 15163409

(51) Int. Cl.
  *G05B 19/418* (2006.01)
  *G05B 19/042* (2006.01)
  *G05B 19/05* (2006.01)

(52) U.S. Cl.
  CPC ... *G05B 19/41835* (2013.01); *G05B 19/0426* (2013.01); *G05B 19/056* (2013.01); *G05B 2219/25428* (2013.01); *G05B 2219/31229* (2013.01); *G05B 2219/32128* (2013.01)

(58) Field of Classification Search
  None
  See application file for complete search history.

(56) References Cited

U.S. PATENT DOCUMENTS

| | | | |
|---|---|---|---|
| 2006/0059283 A1* | 3/2006 | Borst | G05B 19/042 710/107 |
| 2007/0078696 A1* | 4/2007 | Hardin, Jr. | G06Q 10/06 705/7.22 |
| 2013/0211547 A1 | 8/2013 | Buchdunger et al. | |

FOREIGN PATENT DOCUMENTS

| | | |
|---|---|---|
| DE | 10245176 A1 | 4/2004 |
| DE | 102007062395 A1 | 6/2009 |
| DE | 102010029952 A1 | 12/2011 |
| DE | 102010053485 A1 | 6/2012 |

OTHER PUBLICATIONS

Prozessleitsystem SIMATIC PCS 7, Edition 2014/15, Capture 4.

* cited by examiner

*Primary Examiner* — Rami Khatib
(74) *Attorney, Agent, or Firm* — Cozen O'Connor

(57) ABSTRACT

An automation facility and method for expanding the automation facility with at least one field device, wherein expansion of the expansion of the automation facility with a further field device occurs in a simplified manner such that no disruptive influence on process control during the expansion occurs.

4 Claims, 3 Drawing Sheets

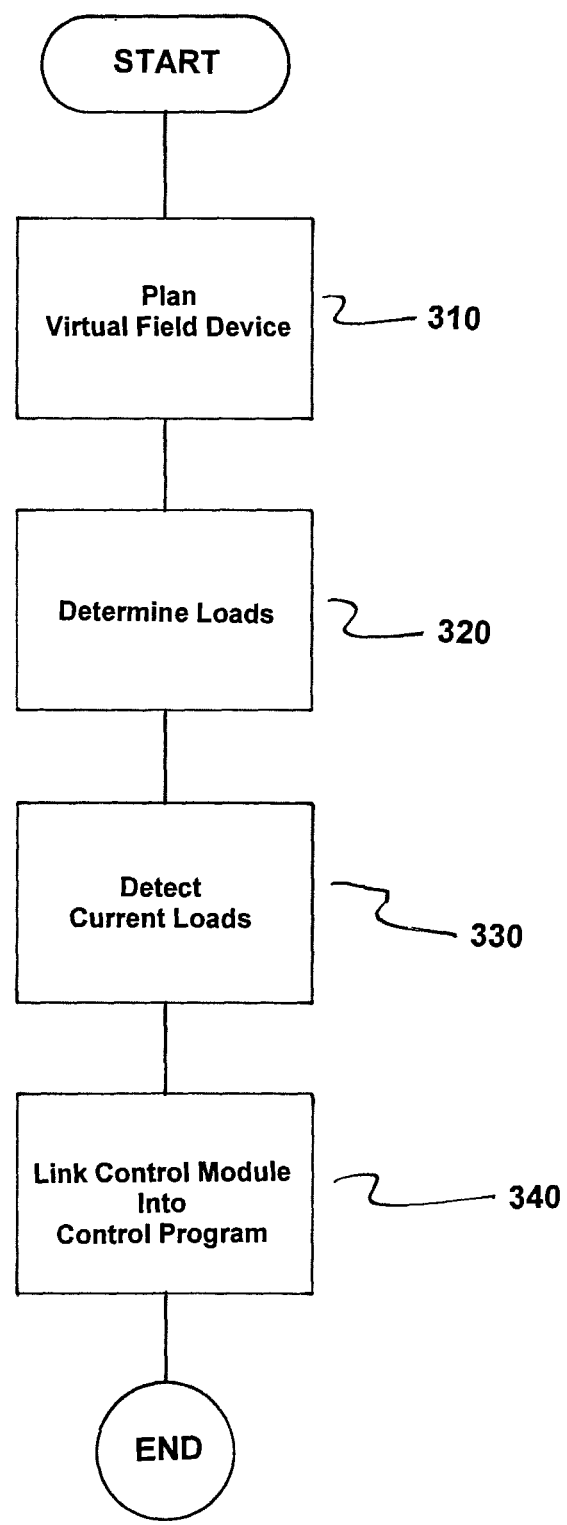

AUTOMATION FACILITY AND METHOD FOR EXPANDING THE AUTOMATION FACILITY WITH AT LEAST ONE FIELD DEVICE

BACKGROUND OF THE INVENTION

1. Field of the Invention

The invention relates to an automation facility and method for expanding the automation facility with a field device, where the automation facility has at least one automation device and at least one field device that are connected to a communication link, and where the automation facility is further planned into a project by an engineering method for solving an automation problem such that the at least one automation device processes a control program comprising a plurality of control modules planned into the project while controlling a process.

2. Description of the Related Art

Siemens Catalog "Process Control System SIMATIC PCS 7, Edition 2014/15, Chapter 4", discloses an engineering system of an automation facility that is configured to plan both hardware and software automation components of the automation facility into a project, where especially as part of an "engineering of the automation", a user creates or plans into a project a control program for controlling a technical process or a plant to be controlled.

Usually, such a plant is not a static production shop that is planned, set up and put into operation once and is not changed thereafter. Instead, the plant is subject to constant changes and adaptations in order to optimize and expand production. To this end, it is usually necessary to also incorporate new process-linked automation components in the form of further field devices into the automation facility. This incorporation is achieved by linking these field devices via a bus to the automation device or to a controller of the automation facility for the purposes of communication, and by correspondingly expanding the control program or the automation software with corresponding control modules for controlling these field devices. As part of such an expansion, it is desirable that there is no disruptive influence on production, such as the production for manufacturing synthetic resin, dyes or fertilizers. This means that the already existing automation components of the automation facility must continue to operate during the commissioning or during the inclusion of the new field devices without significant restriction of production operation, because each restriction or even a production stop (plant shutdown) usually leads to financial penalties.

Whether the available power reserves of the automation device of the communication link are sufficient to enable the new field devices to be put into operation without such a restriction becomes evident when they are being commissioned. Frequently, this commissioning leads to a shutdown of the plant and thus to a halt in production, because the power reserves are insufficient to implement tasks for pre-determined operating cycles of the automation device or within the framework of the predetermined cycles of the communication network of the automation device.

In order to reduce the susceptibility to faults during the commissioning of the new field devices, the power reserves of the controller and the communication network can be estimated as part of planning expansions of the automation device into the project. In addition to clear facts, such as the maximum number of automation components or bus users and the maximum scope of the control software in relation to memory occupancy and processing run time or the processing cycle, above all the long years of experience of the project planners plays a significant role here. Because of these estimations or assumptions, the commissioning is never undertaken without a residual risk. This residual risk can be reduced by setting up a corresponding "shadow plant" or automation facility, in order to pre-test the functioning and the commissioning in advance of implementation. This means considerable costs in material and personnel where, for preparation for the expansion, a shadow plant as a rule also only represents a simulation of the plant and never an exact copy.

SUMMARY OF THE INVENTION

In view of the foregoing, it is therefore an object of the present invention to provide an automation facility and method via which the expansion of the automation facility is simplified.

This and other objects and advantages are achieved in accordance with the invention by providing an automation facility and method in which at least one virtual field device representing a real field device and a control module for controlling the virtual field device are planned into a project, the current communication load is determined, which comprises the load caused by the communication of the process control and the load caused by the communication between the virtual field device and an expansion module of the at least one automation device planned into the project, the current control load of the at least one automation device is detected, which comprises the load caused by the communication of process control and the load caused by the processing of the control module planned into the project, and the control module planned into the project is linked into the control program as a function of the current communication load and the current control load, if the control module is enabled by a user for connection of a real field device to the communication link.

It is advantageous that a "stress test" that is safe and can be increased step-by-step is possible for the expansion of the automation facility, where there is no need for a "shadow automation facility" and it is insured that a shutdown of the automation facility and thus a stop of production is avoided. A user can plan a number of virtual field devices into the project, each of which represents a real field device and can also emulate these real field devices. These virtual field devices are connected to the automation facility or activated in turn, where after each connection of one of the virtual field devices, the current communication load and the current control load of the automation device is initially detected. In the event of the current communication load not exceeding a communication load limit and the control load not exceeding a control load limit, the user can finally expand the automation facility by the real field device that was emulated by the connected virtual field device. Subsequently, a further device of the virtual field devices can be connected in order to once again check whether the automation facility can be expanded by a real field device corresponding to this virtual field device. The user is constantly shown how high the current communication and control load is, so that the automation facility can almost be guided in "homeopathic doses" (by adding a further virtual field device in each case) towards the communication and control load limits.

If, however, the current communication or the current control load exceeds the respective load limit after a virtual field device has been connected, then an expansion of the existing automation facility with the real field device that was emulated by this connected virtual field device is not possible. In this case, the existing automation facility must first be expanded with one or more automation devices and/or means of communication.

In an embodiment of the invention, remote processing is made possible. Here, the user is shown the current communication load and the current control load on an operator control and monitoring device, where the user can enable the control module via this device if the current communication load and the current control load do not exceed the respective load limit.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention, its embodiments and also its advantages are explained in greater detail below with reference to the drawing, in which an exemplary embodiment of the invention is illustrated, and in which:

FIG. 3 is a flowchart of the method in accordance with the invention.

DETAILED DESCRIPTION OF THE EXEMPLARY EMBODIMENTS

Figure 1:
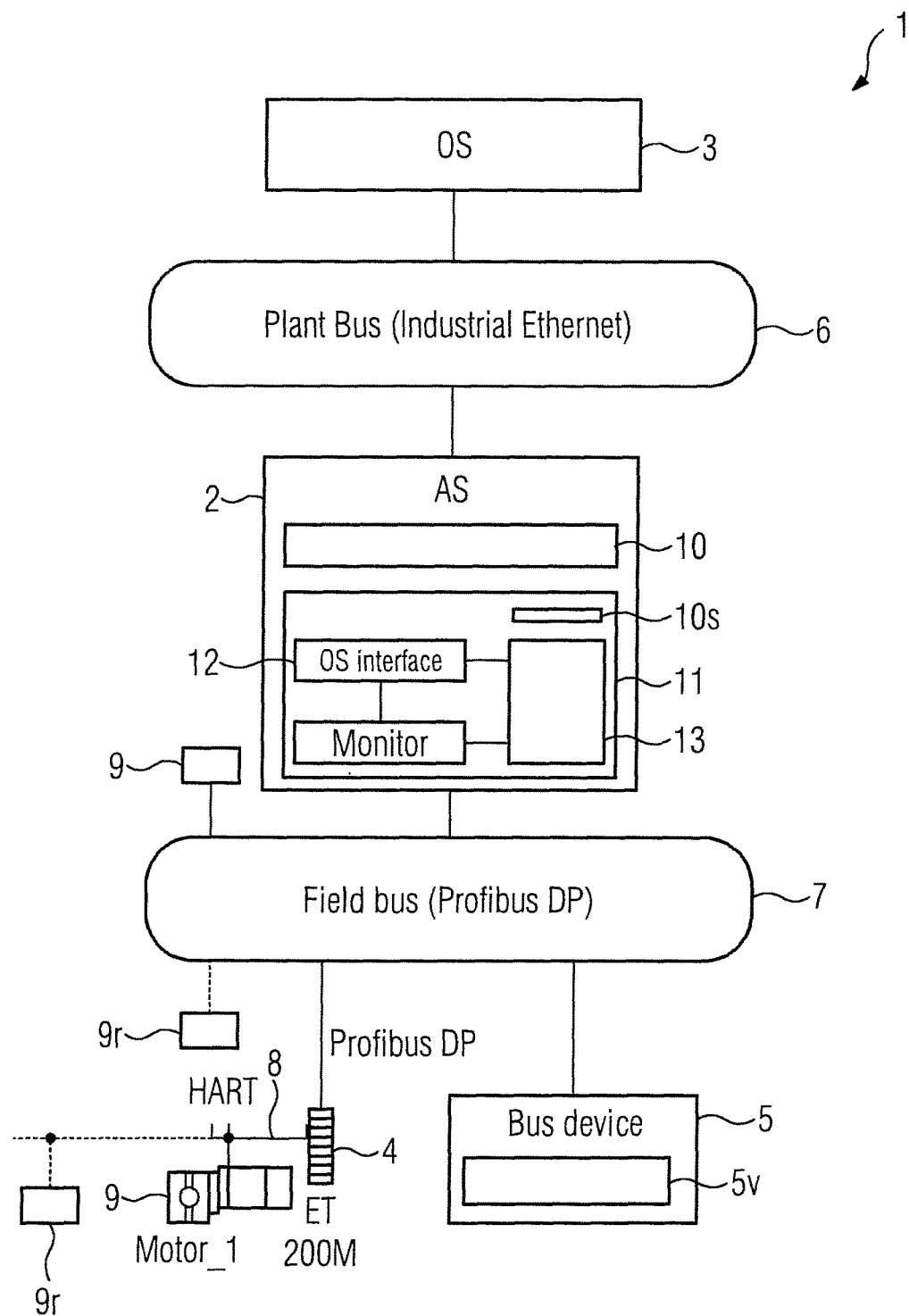
FIG. 1 is a schematic block diagram showing the components of an automation facility.

Shown in FIG. 1 by the number 1 is an automation facility 1 planned into a project by an engineering system (not shown). In the present exemplary embodiment, this comprises an automation device 2, an OS client or an operator control and monitoring device 3 of an OS operator system, which also has an OS server (not shown), a decentralized periphery 4 and a communication user 5. The automation device 2 communicates with the OS client 3 via a communication link 6 and via a further communication link 7 with the decentralized periphery 4 and the communication user 5, where the communication links 6, 7 are formed as bus connections. A plurality of field devices 9 (e.g., actuators, or sensors) is connected to the bus 7 and/or to a further bus 8 connected to the decentralized periphery 4 where, during the process control, i.e., during the run operation of the automation device 2, the field devices 9 are controlled by control modules. These control modules are components of a control program that is planned into the project or created during engineering by an engineering method in accordance with an automation problem to be solved.

Engineering or an engineering method known per se for creating a control program is based on a Continuous Function Chart (CFC) able to be run on an engineering system and on Sequential Continuous Function Chart (SFC) editors.

A user creates the control program for the automation device 2 graphically via the CFC editor from prefabricated modules in accordance with the automation problem to be solved and to do this selects the modules, e.g., a closed-loop control or counter module, from an available set of modules, places the modules, such as by Drag & Drop, in a function plan (e.g., CFC plan) and connects these to one another by a mouse click. After the user has created all functions in the function plan, the engineering system creates CFC functions able to be read by the automation device 2, which is loaded into the automation device 2 and processed there as part of the process control for solving the automation problem.

By means of the SFC editor the user further graphically creates, in the usual manner, a sequential continuous function (chart) (SCF), which usually comprises a plurality of step chains, which in turn have a plurality of recipe elements as well as transitions, such as recipe elements in the form of recipe operations or recipe functions, such as dosing, heating or stirring. From this sequential function chart, the engineering system creates (SFC) objects able to be processed by the automation device 2, which the engineering system compiles and loads into the automation device 2.

During the process control, i.e., in RUN mode of the automation device 2, the interaction and linkage between the (SFC) objects and the CFC functions is effected by process values and control signals (SFC data), where an operator is further shown the step chain on the OS client 3. As a result, the operator is provided with the ability to monitor the recipe element of the step chain that is currently being processed. Each step of the step chain is assigned a specific action, which the CFC functions parameterize and activate, where corresponding control signals are set for this purpose. The process values comprise process input values (actual values), which sensors feed to the automation device 2 and that the automation device 2 transfers to the OS server for storage in a process image, as well as process output values (required values) that the OS server feeds to the automation device 2 for controlling the actuators.

In the present exemplary embodiment, it is assumed that a control program 10 (SFCs, CFCs) planned into a project is stored in the automation device 2 and the automation device 2 is currently processing the control program 10 for process control. In order to be able to expand the automation facility 1 by one or more real field devices 9r, during this process control, without disruptive influences on the process control, a virtual field device 5v planned into the project by the engineering system and an expansion device 11 also stored in the automation device 2 are stored in the communication user 5 for each of these field devices 9r, which for each virtual field device 5v has a projected control module 10s for controlling the respective virtual field device 5v. These virtual field devices 5v represent the real field devices and are configured to emulate the real field devices. The expansion module 11 is further provided with an OS interface 12 for exchange of information between the expansion module 11 and the OS client 3 where, on the one hand, the user can initiate the expansion of the automation facility 1 by a corresponding input on the OS client 3 and, on the other hand, the OS client 3 shows the user the current communication and control load. In addition, the user, by a further input on the OS client 3, can enable the respective control modules 10s, so that the expansion module 11, as a function of the current communication and control load, links the respective control modules 10s into the control program.

The automation facility 1 is expanded in a manner by which a user initially selects one of the virtual field devices 5v planned into the project by, for example, choosing or marking an icon assigned to this field device 5v and displayed on the OS client 3. As a result of this selection, an executive part 13 of the expansion module 11 communicates with this virtual field device 5v stored in the communication user 5, where the communication user 5 determines and stores the current communication load. This communication load comprises the load caused by the communication between the virtual field device 5v and the executive part 13 and the load caused by the communication of the process control. The formulation "the load caused by the communication of the process control" is understood as the load on the communication link 7 during the processing of the control program 10, during which the automation device 2 communicates with the real field devices 9. The fact that the communication user 5 detects the communication load means that there is no additional load on the automation device 2. The expansion module 11 reads out the current communication load stored in the communication user and transfers this via the OS interface 12 to the OS client 3, which shows the current communication load to the user. In the event of this current communication load reaching or exceeding a predetermined communication load limit, the user is notified via a display or message on the OS client that an expansion of the existing automation facility 1 with the real field device 9r corresponding to the virtual field device 5v is not possible unless the automation facility 1 is expanded by a further communication device (bus connections, switches, . . . ).

On the other hand, in the event of this current communication load not exceeding the predetermined communication load limit, the executive part 13 automatically activates the control module 10s for controlling the selected virtual field device 5v. During this control, the expansion module 11 detects the control load of the automation device 2, which comprises the load caused by the process control and the load caused by the processing of the control module 10s for controlling the selected virtual field device 5v, where these two loads have an effect on the processing cycle of the automation device 2. In this case the formulation "the load caused by the process control" is understood as the load on the automation device 2 during the processing of the control program 10. To display the current control load the expansion module 11 likewise transfers the current control load via the OS interface 12 to the OS client 3, through which, as well as the current communication load, the current control load of the automation facility 1 is also displayed to the user. In the event of this current control load not reaching or undershooting a predetermined control load limit, the expansion module 11 links the control module 10s into the control program 10, if the user enables this control module 10s for connecting the real field device 9r to the bus. The enabling by the user is performed via a suitable input on the OS client 3, on which the user is shown the control load limit as well as the current control load. After the user has enabled the control module 10s, the real field device 9r corresponding to the virtual field device 5v can be connected to the bus 8. However, in the event of the current control load reaching or exceeding the predetermined control load limit, the expansion module 11 blocks the control module 10s, which means that this module is not linked into the control program 10. In this case, the user is also shown that the existing automation facility 1 cannot be expanded by this field device. An expansion of the automation facility is then only possible when the facility is expanded by a further automation device, which enables the control load to be distributed to a number of automation devices.

The automation facility 1 can be expanded by further field devices in the above-described manner. To do this, a further device of the virtual field devices is initially connected and a check is made to once again determine whether the automation facility 1 can be expanded by a further real field device corresponding to this virtual field device. To this end, the user is always shown what the current communication and control load is, so that the automation facility 1 can almost be guided towards the communication and control load limit in "homeopathic doses".

Figure 2:
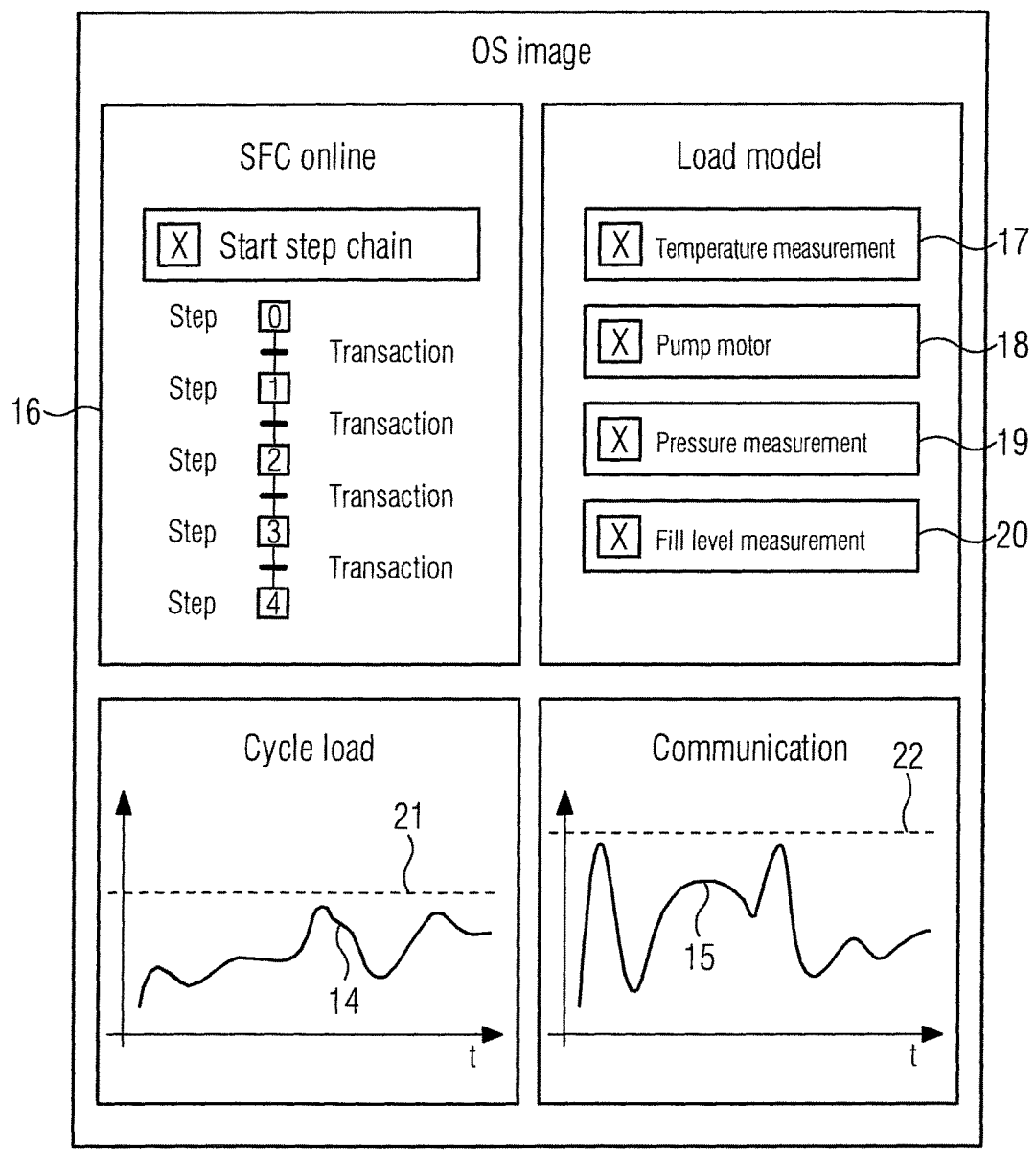
FIG. 2 is a schematic block diagram of the display of a communication and control load on an operator control and monitoring device.

Reference is made below to FIG. 2, in which the current control load 14 and also the current communication load 15 of an automation facility is displayed on the OS client. By means of the respective steps of an (SFC) step chain 16 able to be activated by the user, the user increases the control load of an automation device of the automation facility step-by-step and also the communication load of the automation facility, where the user recognizes that, as part of the "step-by-step" increase in the load or the connection of four virtual field devices 17, 18, 19, 20 during the process control or the processing of a control program, the control load 14 still lies below a control load limit 21 and the communication load 15 still lies below the communication load limit 22. This means that four real field devices, which have been emulated by the four virtual field devices, can be connected to the automation facility without the automation facility having to be expanded by a further automation device and further ways of communication.

FIG. 3 is a flowchart of a method for expanding an automation facility (1) with at least one field device (9), where the automation facility (1) includes at least one automation device (2) and at least one field device (9) which are connected to a communication link (7, 8) and is planned into a project by an engineering method for solving an automation problem such that the at least one automation device (2) processes a projected control program (10) that comprises a plurality of control modules when controlling a process. The method comprises planning at least one virtual field device (5v) representing a real field device (9r) and a control module (10s) for controlling the virtual field device (5v) into the project, indicated in step 310.

Next, a current communication load comprising a load caused by communication of the process control and the load caused by the communication between the at least one virtual field device (5v) and an expansion module (11) of the at least one automation device (2) planned into the project, is determined as indicated in step 320.

Next, the current control load of the at least one automation device (2) comprising the load caused by communication of the process control and the load caused by processing of a control module (10s) planned into the project are detected, as indicated in step 330.

The control module (10s) planned into the project is now linked into the control program (10) as a function of the current communication load and the current control load, if the control module (10s) is enabled by a user for connection of a real field device (9r) to the communication link (7, 8), as indicated in step 340.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for expanding an automation facility with at least one field device, the automation facility including at least one automation device and at least one field device which are connected to a communication link and being planned into a project by an engineering method for solving an automation problem such that the at least one automation device processes a projected control program which comprises a plurality of control modules when controlling a process, the method comprising:
    planning at least one virtual field device representing a real field device and a control module for controlling the virtual field device into the project;
    determining a current communication load comprising a load caused by communication of the process control and the load caused by the communication between the at least one virtual field device and an expansion module of the at least one automation device planned into the project;
    detecting a current control load of the at least one automation device comprising the load caused by communication of the process control and the load caused by processing of a control module planned into the project; and
    linking the control module planned into the project into the control program as a function of the current communication load and the current control load, if the control module is enabled by a user for connection of a real field device to the communication link.

2. The method as claimed in claim 1, wherein the current communication and control loads are displayed to a user on an operator control and monitoring device and the control module is enabled via the monitoring device.

3. An automation facility, comprising:
    at least one automation device; and
    at least one field device, which are connected to a communication link;
    wherein the at least one automation device is planned into a project by an engineering method for solving an automation problem such that the at least one automation device, when controlling a process, processes a control program planned into the project which comprises a plurality of control modules;
    wherein at least one projected virtual field device representing a real field device is stored in a projected communication user connected to the communication link;
    wherein the communication user determines a current communication load comprising a load caused by communication of the process control and a load caused by communication between the at least one projected virtual field device and a projected expansion module of the at least one automation device;
    wherein a projected control module for controlling the virtual field device is stored in the projected expansion module;
    wherein the expansion module detects the current control load of the at least one automation device, which comprises the load caused by the process control and the load caused by the processing of the projected control module; and
    wherein the expansion module is configured to link the projected control module into the control program as a function of the current control load, if a user enables the projected control module for connection of a real field device to the communication link.

4. The automation facility as claimed in claim 3, wherein the automation facility includes an operator control and monitoring device to display the current communication and control load and to enable the control module.

* * * * *